United States Patent [19]
Beech

[11] Patent Number: 5,977,804
[45] Date of Patent: Nov. 2, 1999

[54] DIGITAL SYNTHESIZER

[75] Inventor: Brian Herbert Beech, Hampshire, United Kingdom

[73] Assignee: NDS Ltd., Middlesex, United Kingdom

[21] Appl. No.: 08/905,661

[22] Filed: Aug. 4, 1997

[30] Foreign Application Priority Data

Aug. 6, 1996 [GB] United Kingdom ............ 9616537

[51] Int. Cl.⁶ ................................... H03B 19/00
[52] U.S. Cl. ................... 327/107; 327/105; 327/106; 364/718
[58] Field of Search ..................... 327/105, 106, 327/107, 129, 126, 113; 364/721, 718.02

[56] References Cited

U.S. PATENT DOCUMENTS 4,901,265  2/1990  Kerr et al. ............................. 327/107

*Primary Examiner*—Dinh T. Le
*Attorney, Agent, or Firm*—Proskauer Rose LLP

[57] ABSTRACT

The invention concerns a method and apparatus to synthesize a frequency employing digital phase words to represent successive phase values. A digital dither signal generator is used to generate a succession of dither words which are summed with the phase words to form address words. The address words are used to address a store to convert the address words to waveform values. The periodic quantisation noise introduced by the digital process is made more random by means of the dither words thereby reducing the quantisation noise components while accepting an increased total noise power. The synthesizer is of particular advantage when used to generate the reference frequency for a frequency multiplier implemented as a phase lock loop. By making the dither sequence repetition frequency outside the phase lock loop bandwidth, the spurious components are removed from the frequency range of interest.

8 Claims, 6 Drawing Sheets

DIGITAL SYNTHESIZER

FIELD OF THE INVENTION

The present invention relates to the field of digital synthesizers which may be employed alone to generate an output waveform or may be employed to generate a reference frequency for a frequency multiplier implemented as a phase lock loop.

BACKGROUND OF THE INVENTION

It is already known to implement a direct digital synthesizer including a frequency latch, a phase accumulator, and a ROM based waveform generator. The ROM based waveform generator is used to drive a digital to analogue converter to produce the desired analogue output waveform. The phase accumulator is used to generate a sequence of digital binary values which are used to address the ROM to select stored digital values representing the waveform to be generated. The size of the ROM can be reduced by subjecting the digital values from the phase accumulator to a quantisation process to truncate the size of the digital words which address the ROM.

Such a quantisation process results in the introduction of periodic quantisation noise and it has already been proposed to add a dither signal to the output from the phase accumulator so that the digital values from the phase accumulator are added to random digital values from the dither generator. The result is to make the quantisation noise more random and thereby reduce the spurious quantisation components whilst accepting an increased total noise power.

SUMMARY OF THE INVENTION

The present invention provides an improved direct digital synthesiser which offers the efficient suppression of spurious components and is advantageously employed in low cost consumer products where high performance is required and yet there is a need to reduce the occupied silicon area. This leads to a demand for a reduction in the number of bits to be addressed in the ROM and output to the digital to analogue converter. The invention is of particular benefit when employed in a system in which the direct digital synthesizer is used to generate the reference frequency for a frequency multiplier implemented as a phase lock loop.

According to the present invention there is provided a method of synthesizing a frequency signal comprising the steps of generating a succession of digital phase words representing successive phase values of the signal, generating a succession of digital dither words, summing the phase words with the dither words to form address words, and using the address words to address stored values which convert the address words to waveform values, the dither words being generated at a rate less than the rate at which the digital phase words are generated.

Further according to the present invention, there is provided a digital synthesizer comprising: digital phase generating means to generate a succession of digital phase words representing successive phase values of the synthesizer, a dither signal generator to generate a succession of digital dither words, summing means to sum the phase words and the dither words to form digital address words, and a store which is addressable by the address words to convert the address words to waveform values, the dither signal generator being adapted to generate the dither words at a rate which is less than the rate at which the digital phase generating means generates the phase words.

Preferably, the digital phase generating means includes a sawtooth to triangle converter to convert phase values representing a sawtooth waveform to phase values representing a triangle waveform.

The dither words are preferably taken from a register of Y bits in the dither signal generator, the dither signal generator having a repetition length equal to $2^Y-1$ bits.

BRIEF DESCRIPTION OF THE DRAWINGS

The invention will now be described by way of example with reference to the accompanying drawings in which.

DETAILED DESCRIPTION OF THE INVENTION

Figure 1:
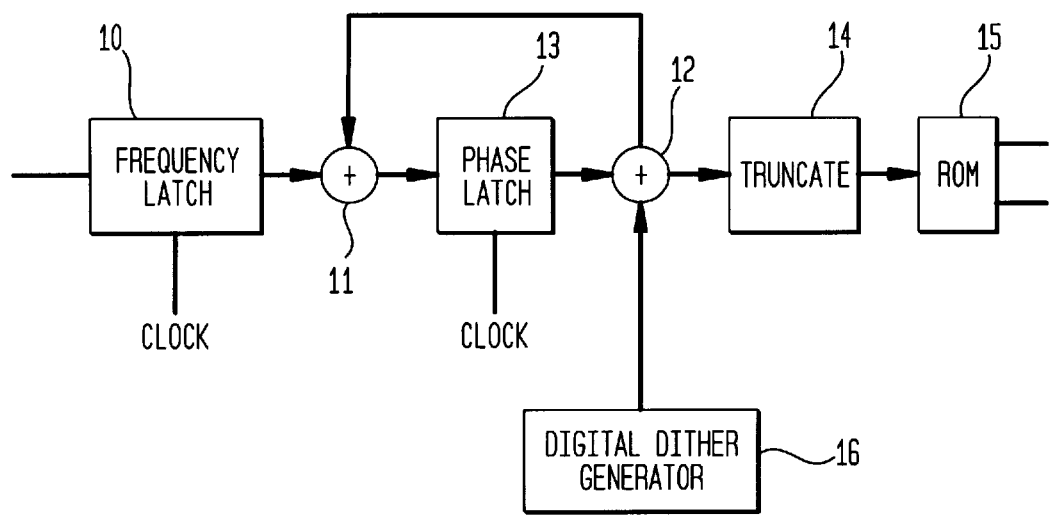
FIG. 1 shows, in block schematic form, a prior art direct digital synthesizer.

Referring to FIG. 1, there is shown a prior art direct digital synthesizer including a frequency latch 10, which stores a binary frequency word indicating the desired operating frequency of the synthesizer. The frequency latch is clocked to supply the binary frequency word as one input to an adder 11. The adder 11 has another input from an adder 12 and supplies a sum output to a phase latch 13. The phase latch 13 accumulates the summed output values from the adder 11 to generate a succession of incremental phase values and the latch 13 is clocked to supply the phase values as one input to the adder 12.

The adder 12 has an output connected to supply phase values to a truncator 14 which truncates the binary phase values from the adder 14 by omitting a number of the least significant bits. A ROM 15 is addressed by the truncator 14 to generate a sine and a cosine output representing the waveform to be generated by the synthesizer. The ROM is connected to supply a digital to analogue converter from which an output sine waveform is derived.

It is known that the quantisation of phase values to address the ROM 15 results in the introduction of quantisation noise into the analogue output waveform. To make the quantisation noise more random and thereby reduce the spurious quantisation components, a digital dither generator 16 is provided which generates a series of pseudo-random binary values which are supplied as a second input to the adder 12.

Figure 2:
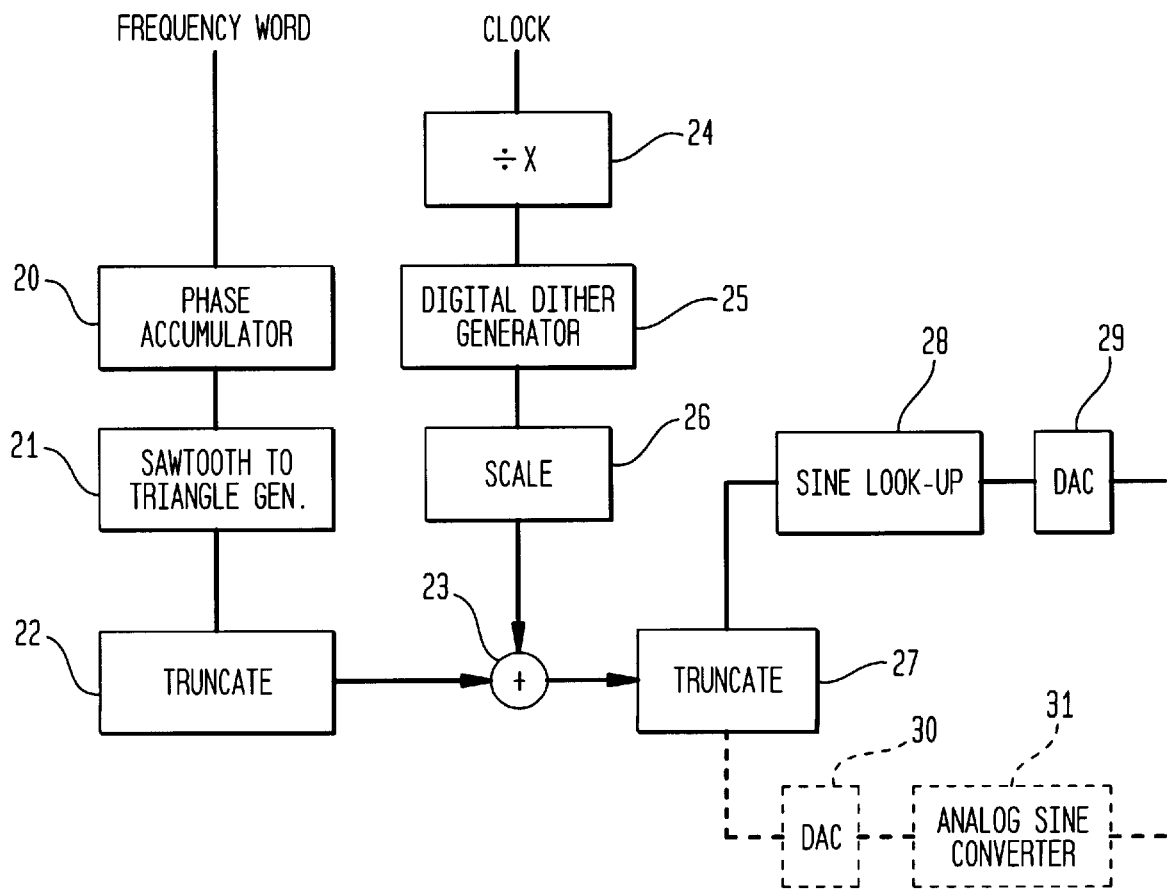
FIG. 2 shows a direct digital synthesizer embodying the present invention.

Referring now to FIG. 2, a direct digital synthesizer according to the present invention includes a phase accumulator 20 which receives a binary frequency word representing the operating frequency of the synthesizer. The phase accumulator is clocked at a clock rate DDSCLK to generate a succession of binary phase words each of L bits and which together are representative of a sawtooth waveform. The phase words from the phase accumulator are supplied to a sawtooth-to-triangle generator 21 which converts the binary values from the phase accumulator to converted values presenting an equivalent triangle waveform. Each of the digital phase words from the generator 21 is of L-1 bits in length. The digital phase words from the generator 21 are truncated by a truncator 22 and supplied as one input to an adder 23.

A clock signal at the clock rate DDSCLK is supplied to a divider 24 which divides the clock frequency by a value X. The divider is used to drive a digital dither generator 25 which generates a series of pseudo-random digital values which are scaled in a scaler 26 and then supplied as a second input to the adder 23 to be added arithmetically to the output from the truncator 22. The dither values are generated as W bits from a dither generator register of Y bits in length where the repetition length of the dither generator is 2–1 bits. The parameters X and Y have a large influence on the final output spectrum of the synthesizer.

The output from the adder 23 is supplied to a truncator 27 and are truncated to a word length N which is the word length of a sine lookup table 28 to which the truncated words of length N are addressed. A digital to analogue converter 29 receives the digital values addressed to the table 28 to supply the desired output waveform which is of the frequency selected by the frequency word at the input to the phase accumulator 20.

The synthesizer of FIG. 2 is of particular advantage when the output from the digital to analogue converter 29 is used to generate the reference frequency for a frequency multiplier implemented as a phase lock loop (PLL). If the frequency multiplication factor is K, then the levels of the spurious components are increased by $20 * \log_{10} K$ dB and so the performance of the synthesizer becomes critical. If the phase lock loop has a bandwidth B, the value of DDSCLK/$(X*(2^Y-1))$ is designed to be substantially larger than B.

The application of the dither signal has the effect of suppressing spurious components but increasing the noise floor of the synthesizer. By making the dither sequence of repetition frequency substantially outside the PLL bandwidth, the spurious components are removed from the frequency range of interest and the energy of the spurious components is forced outside the loop bandwidth and the noise floor between the spectral lines of the dither sequence is very low. The size of the sine lookup table 28 is minimised in this arrangement because the truncation of the phase words is all done before the lookup table 28.

Figure 3:
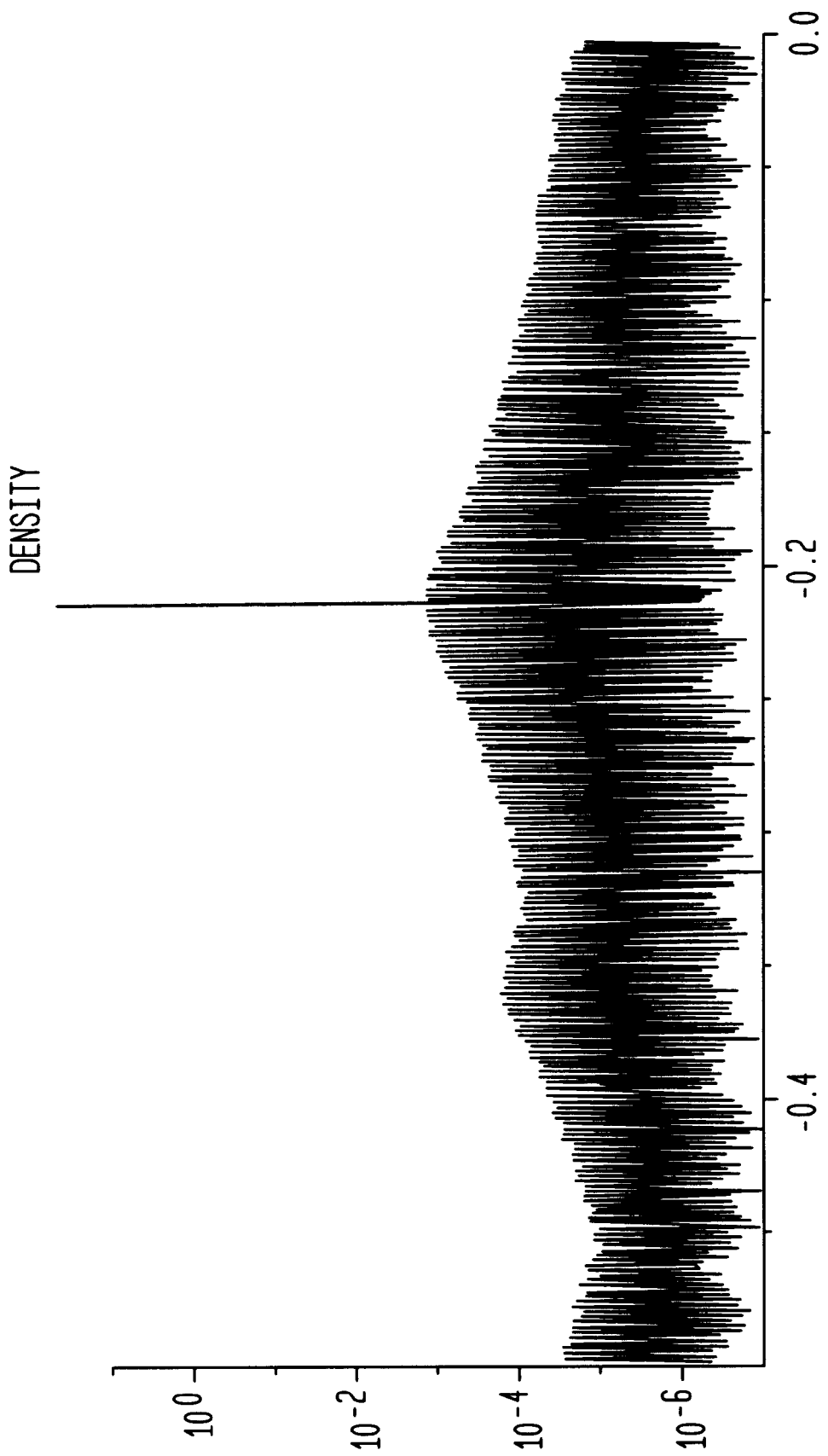
FIGS. 3 to 7 are explanatory waveform diagrams.
Figure 4:
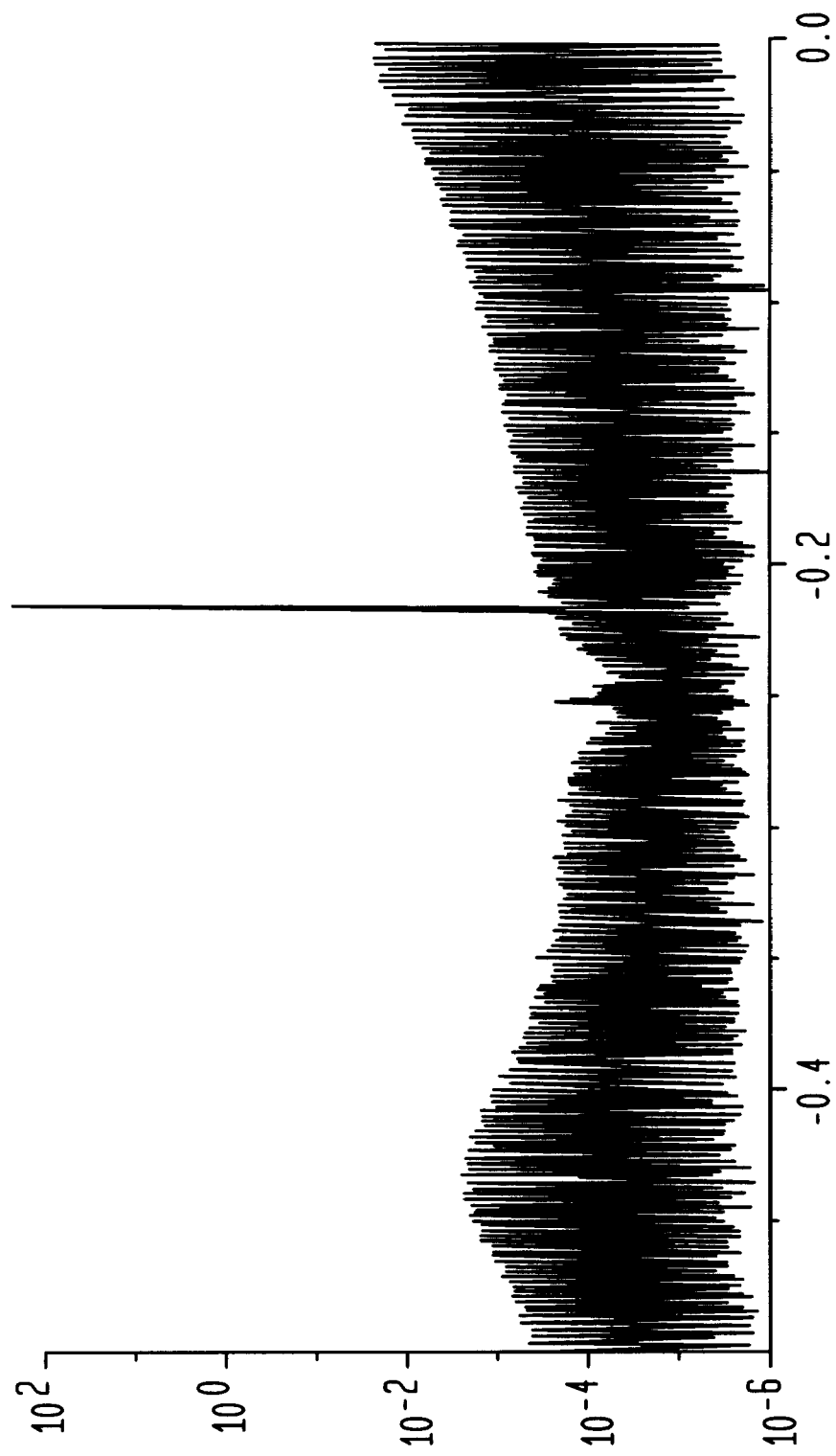

The result of using the prior art arrangement in FIG. 1 is shown in the explanatory waveform diagram of FIG. 3 where the frequency axis 0.0 represents the sampling frequency and the result is shown for a range from 0.5 to 0.0. The corresponding result for the inventive arrangement of FIG. 2 is shown in the explanatory waveform diagram of FIG. 4 with a value of X=4. The multiplicity of spectral lines is the result of using the dither generator and it can be seen that there is a minimum in FIG. 4 which is absent from the result shown in FIG. 3. The minimum occurs at −0.25 which is equivalent to 0.75* sampling frequency.

A minimum can be introduced in the spectral lines at different frequencies depending on the choice of the value of X and advantage is taken of the minimum to force the energy of the spurious components outside the loop bandwidth of the phase lock loop already referred to. In general a value of X can be found to optimise the performance for any given application.

An alternative embodiment of the invention is shown in FIG. 2 and is represented by the dashed lines. According to the alternative embodiment, the output from the truncator 27 is fed directly to a digital to analogue converter 30 and the analogue output from this if fed to a sine converter 31 implemented in analogue form.

Figure 5:
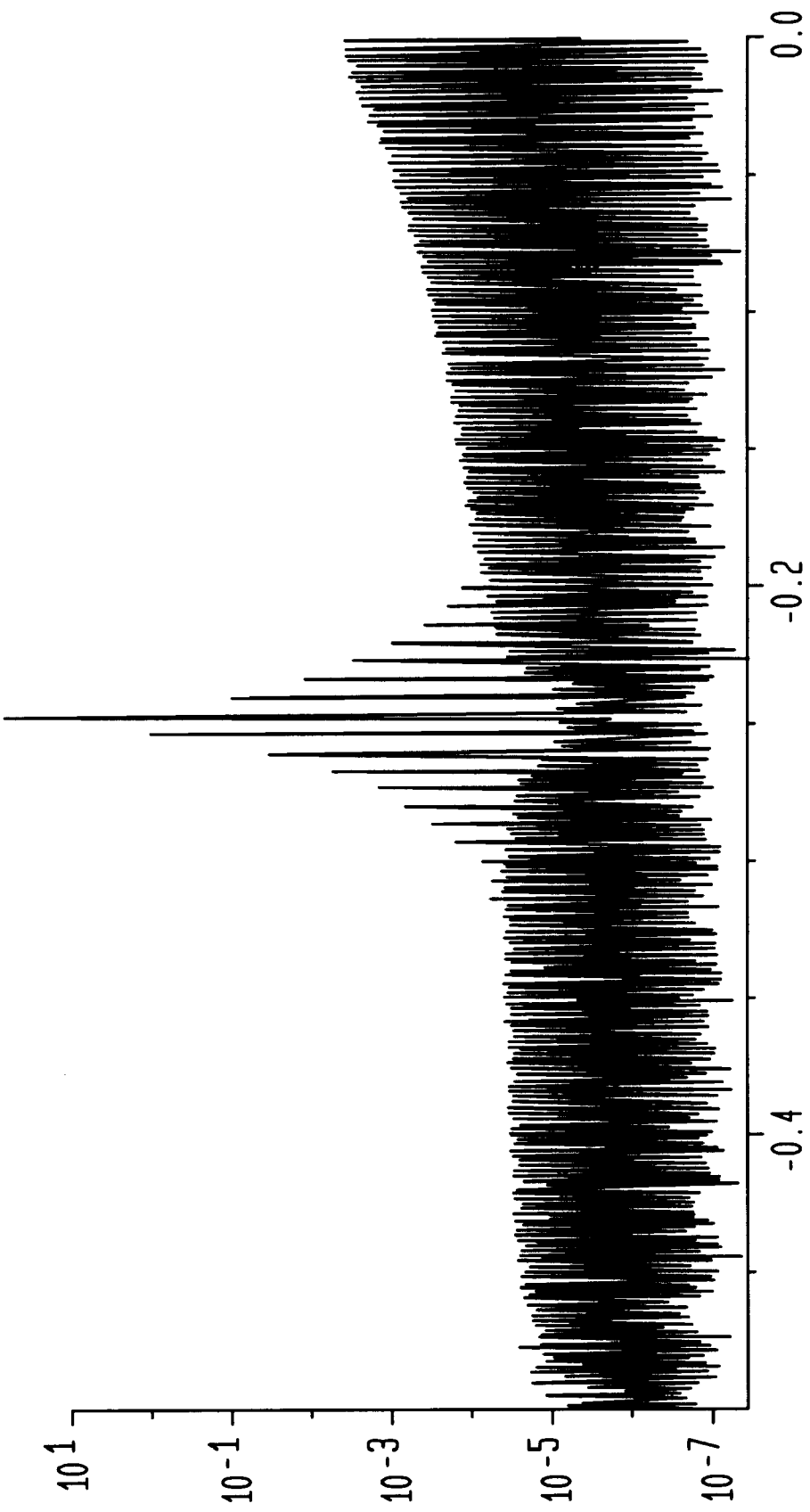

FIG. 5 shows a result where there is no sine conversion and the spurious components are clearly seen.

Figure 6:
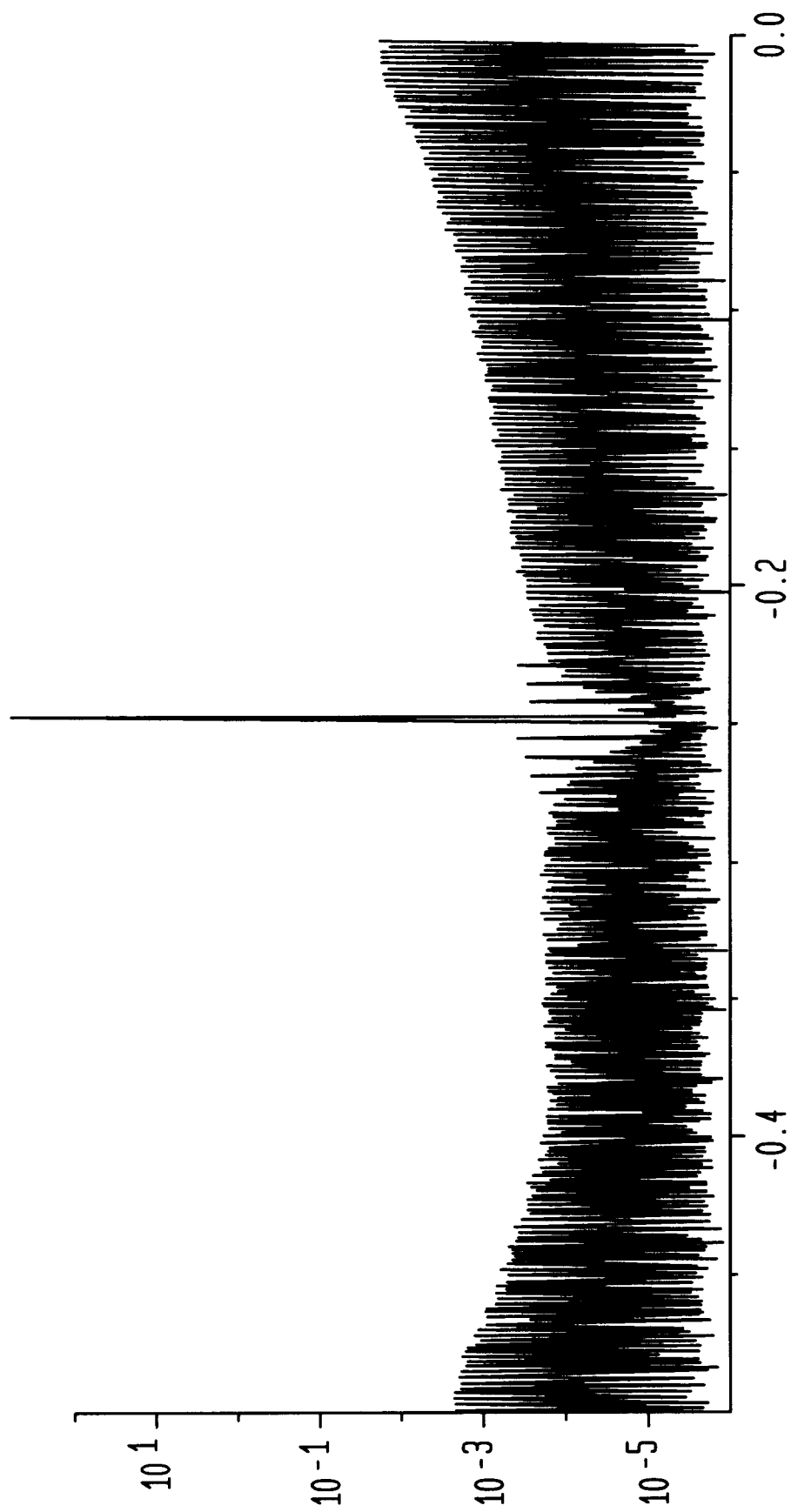

FIG. 6 shows the situation where the first embodiment of the invention is used with a digital sine lookup table and it can be seen that the spurious components are much reduced.

Figure 7:
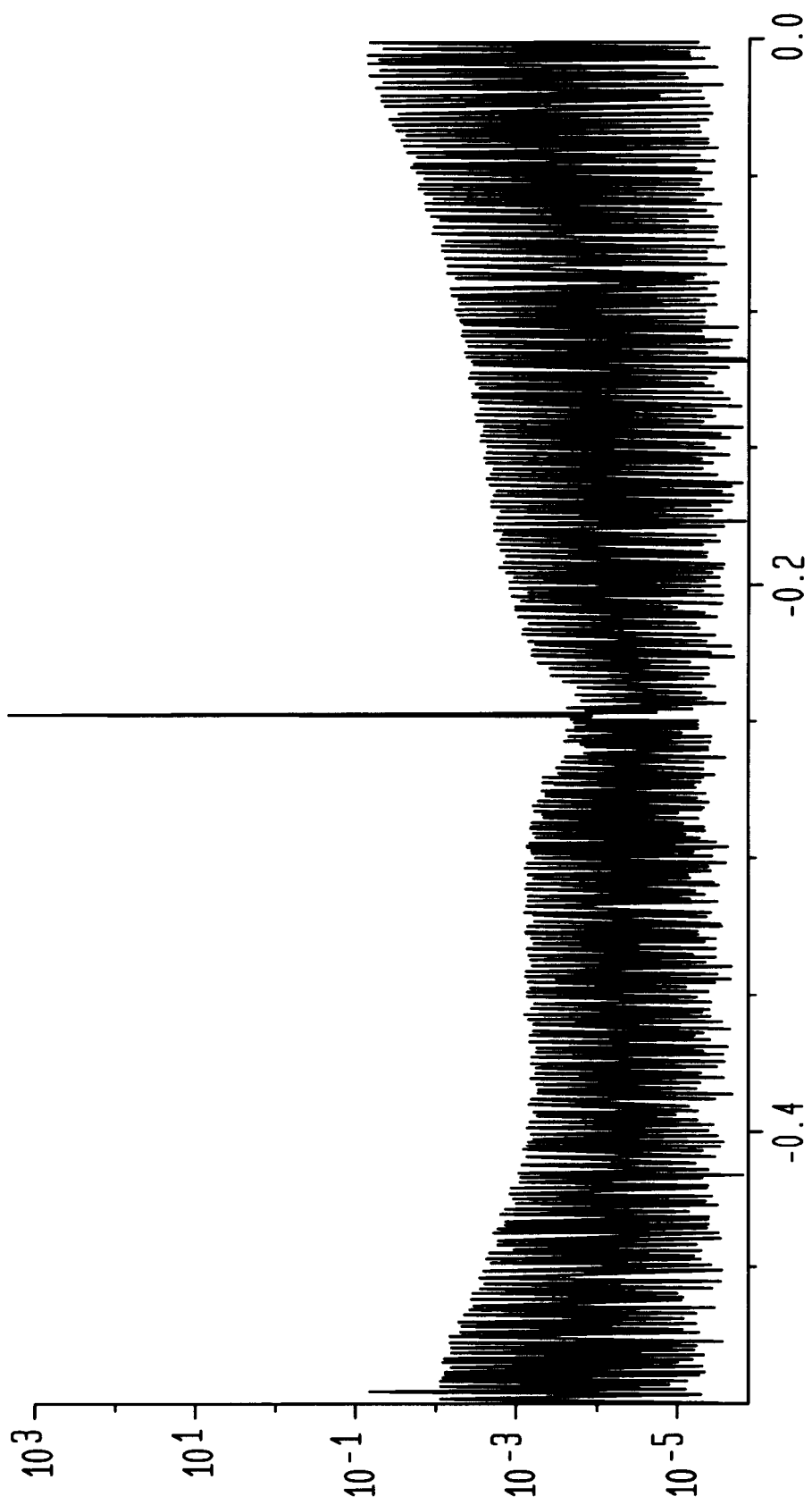

FIG. 7 shows the result for the second embodiment of the invention employing an analogue sine converter and the spurious components are substantially lower than for the digital sine converter.

I claim:

1. A method of synthesizing a frequency signal having a spectrum including a multiplicity of spectral lines, the method comprising the steps of:

generating, at a first rate, a succession of digital phase words representing successive phase values of the signal, generating, at a second rate X, a succession of digital dither words, wherein said second rate X is less than said first rate to create a null in said spectrum of spurious components, summing the phase words with the dither words to form address words, and using the address words to address stored values which convert the address words to waveform values representing the frequency signal having a minimum of spectral lines of said multiplicity of spectral lines.

2. A method as claimed in claim 1, wherein the digital phase words represent a sawtooth waveform and the method includes the further step of converting the phase values to represent a triangle waveform.

3. A method as claimed in claim 2, wherein said words are taken from a register of Y bits and the dither words have a repetition length of $2^Y-1$ bits.

4. A method as claimed in claim 3 further comprising the step of generating a multiplier reference signal for a frequency multiplier implemented as a phase lock loop based on the synthesized frequency signal.

5. A digital frequency synthesizer to generate a frequency signal having a spectrum including a multiplicity of spectral lines, comprising:

a generator to generate, at a first rate, a succession of digital phase words representing successive phase values of the synthesizer, a dither signal generator to generate, at a second rate X, a succession of digital dither words, wherein said second rate X is less than said first rate, an adder to sum the phase words with the dither words to form address words, and a store which is addressable by the address words to form waveform values representing the frequency signal having a minimum of spectral lines of said multiplicity of spectral lines.

6. A digital frequency synthesizer according to claim 5, wherein the digital phase generating means includes a sawtooth to triangle converter to convert phase values representing a sawtooth waveform to phase values representing a triangle waveform.

7. A digital frequency synthesizer according to claim 6, wherein the dither signal generator has a register of Y bits for the dither words and the dither signal generator has a repetition rate of $2^Y-1$ bits.

8. A digital frequency synthesizer according to claim 7 having an output to supply a multiplier reference signal to a frequency multiplier implemented as a phase lock loop, wherein said multiplier reference signal being based on said reference signal.

* * * * *